United States Patent [19]

Uetani et al.

[11] Patent Number: 5,290,656
[45] Date of Patent: Mar. 1, 1994

[54] RESIST COMPOSITION, NOVEL PHENOL COMPOUND AND QUINONE DIAZIDE SULFONIC ACID ESTER OF NOVEL PHENOL COMPOUND

[75] Inventors: Yasunori Uetani, Minoo; Makoto Hanabata, Hyogo; Hirotoshi Nakanishi, Osaka; Koji Kuwana, Fujiidera; Yukio Hanamoto, Toyonaka; Fumio Oi, Ashiya; Jun Tomioka, Takarazuka, all of Japan

[73] Assignee: Sumitomo Chemical Company, Limited, Osaka, Japan

[21] Appl. No.: 5,429

[22] Filed: Jan. 19, 1993

Related U.S. Application Data

[63] Continuation of Ser. No. 347,065, May 4, 1989, abandoned.

[30] Foreign Application Priority Data

| May 7, 1988 | [JP] | Japan | 63-111179 |
| Aug. 4, 1988 | [JP] | Japan | 63-195572 |
| Oct. 13, 1988 | [JP] | Japan | 63-258936 |
| Dec. 26, 1988 | [JP] | Japan | 63-330503 |
| Dec. 26, 1988 | [JP] | Japan | 63-330504 |

[51] Int. Cl.$^5$ .................. G03C 1/52; C07C 309/76
[52] U.S. Cl. ........................... 430/165; 430/189; 430/193; 524/159; 534/564
[58] Field of Search .......... 552/8; 568/722, 723; 430/165, 189, 193; 524/159; 534/564

[56] References Cited

U.S. PATENT DOCUMENTS

| 3,188,210 | 6/1965 | Fritz et al. | 430/193 |
| 4,460,798 | 7/1984 | Klopfer et al. | 568/723 |
| 4,464,458 | 8/1984 | Chow et al. | 430/165 |
| 4,837,121 | 6/1989 | Blakeney et al. | 430/165 |
| 4,873,169 | 10/1989 | Erdmann et al. | 430/165 |

FOREIGN PATENT DOCUMENTS 59-5243 1/1984 Japan.
60-121445 6/1985 Japan.

*Primary Examiner*—Veronica P. Hoke
*Attorney, Agent, or Firm*—Birch, Stewart, Kolasch & Birch

[57] ABSTRACT

A quinone diazide sulfonic acid ester of a phenol compound of the general formula (I):

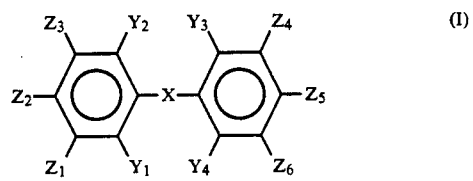

(I)

wherein $Y_1$, $Y_2$, $Y_3$ and $Y_4$ are the same or different and each a hydrogen atom, an alkyl group, a halogen atom or a hydroxyl group, provided that at least one of $Y_1$, $Y_2$, $Y_3$ and $Y_4$ is a hydroxyl group; $Z_1$, $Z_2$, $Z_3$, $Z_4$, $Z_5$ and $Z_6$ are the same or different and each a hydrogen atom, an alkyl, an aryl group, a halogen atom or a hydroxyl group, provided that at least one of $Z_1$, $Z_2$, $Z_3$, $Z_4$, $Z_5$ and $Z_6$ is a hydroxyl group; X is

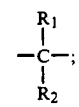

in which $R_1$ and $R_2$ are the same or different and each a hydrogen atom, an alkyl group, an alkenyl group, a cyclo-alkyl group, an alkoxy group or an aryl group, provided that when at least one of $R_1$ and $R_2$ is a hydrogen atom, an alkyl or aryl group is present at the ortho position to a hydroxyl group which is present at the ortho position to X provides a positive resist composition which has a high γ-value.

10 Claims, 12 Drawing Sheets

RESIST COMPOSITION, NOVEL PHENOL COMPOUND AND QUINONE DIAZIDE SULFONIC ACID ESTER OF NOVEL PHENOL COMPOUND

This application is a continuation of application Ser. No. 07/347,065 filed on May 4, 1989, now abandoned.

BACKGROUND OF THE INVENTION

1. Field of the Invention

The present invention relates to a resist composition which comprises a sensitizer and is sensitive to ultraviolet rays (G-line, H-line, I-line and so on), far ultraviolet rays (eximer laser and so on), electron rays and radio active rays such as X rays, a novel phenol compound, a quinone diazide sulfonic acid ester of said novel phenol compound and also a sensitizer to be used in a positive resist composition.

2. Description of the Related Art

A composition containing a compound having a quinone diazide group such as a naphthoquinone diazide group, a benzoquinone diazide group, etc. and an alkali-soluble resin finds use as a positive resist, because upon exposure to ultraviolet rays, the quinone diazide group decomposes to form a carboxyl group whereby the originally alkali-insoluble composition becomes alkali-soluble. A condensation product of a phenol compound (e.g. trihydroxy-benzophenone, tetrahydroxybenzophenone and so on) with a quinone diazide compound is used as a sensitizer.

However, particularly with integrated circuits, miniaturization has proceeded with a rise in the integration level, which results in demands for formation of patterns of submicron order and more excellent resolution (high $\gamma$-value). As a result, the conventional compositions cannot improve the $\gamma$-value to the desired level.

For example, if the amount of quinone diazide group is increased to improve the $\gamma$-value, serious problems such as deterioration of sensitivity and increase of residues after developing arise.

SUMMARY OF THE INVENTION

One object of the present invention is to provide a positive resist composition which has the high $\gamma$-value and can overcome the problems associated with the conventional positive resist compositions.

Another object of the present invention is to provide a sensitizer consisting of a quinone diazide sulfonic acid ester of a phenol compound, which sensitizer is used in a positive resist composition.

Further object of the present invention is to provide a novel phenol compound.

A yet further object of the present invention is to provide a quinone diazide sulfonic acid ester of said novel phenol compound.

Accordingly, the present invention provides a positive resist composition which comprises an alkali-soluble resin and at least one quinone diazide sulfonic acid ester of a phenol compound of the general formula (I):

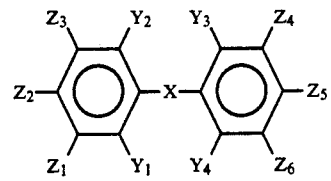

wherein $Y_1$, $Y_2$, $Y_3$ and $Y_4$ are the same or different and each a hydrogen atom, an alkyl group, a halogen atom or a hydroxyl group, provided that at least one of $Y_1$, $Y_2$, $Y_3$ and $Y_4$ is a hydroxyl group; $Z_1$, $Z_2$, $Z_3$, $Z_4$, $Z_5$ and $Z_6$ are the same or different and each a hydrogen atom, an alkyl, an aryl group, a halogen atom or a hydroxyl group, provided that at least one of $Z_1$, $Z_2$, $Z_3$, $Z_4$, $Z_5$ and $Z_6$ is a hydroxyl group; X is

in which $R_1$ and $R_2$ are the same or different and each a hydrogen atom, an alkyl group, an alkenyl group, a cyclo-alkyl group, an alkoxy group or an aryl group, provided that when at least one of $R_1$ and $R_2$ is a hydrogen atom, an alkyl or aryl group is present at the ortho position to a hydroxyl group which is present at the ortho position to X.

Further, the present invention relates a sensitizer to be used in the positive resist composition.

Further more, the present invention relates to a novel phenol compounds which are included in the general formula (I) and also a quinone diazide sulfonic acid ester of such novel phenol compounds (I).

DETAILED DESCRIPTION OF THE INVENTION

Figure 1:
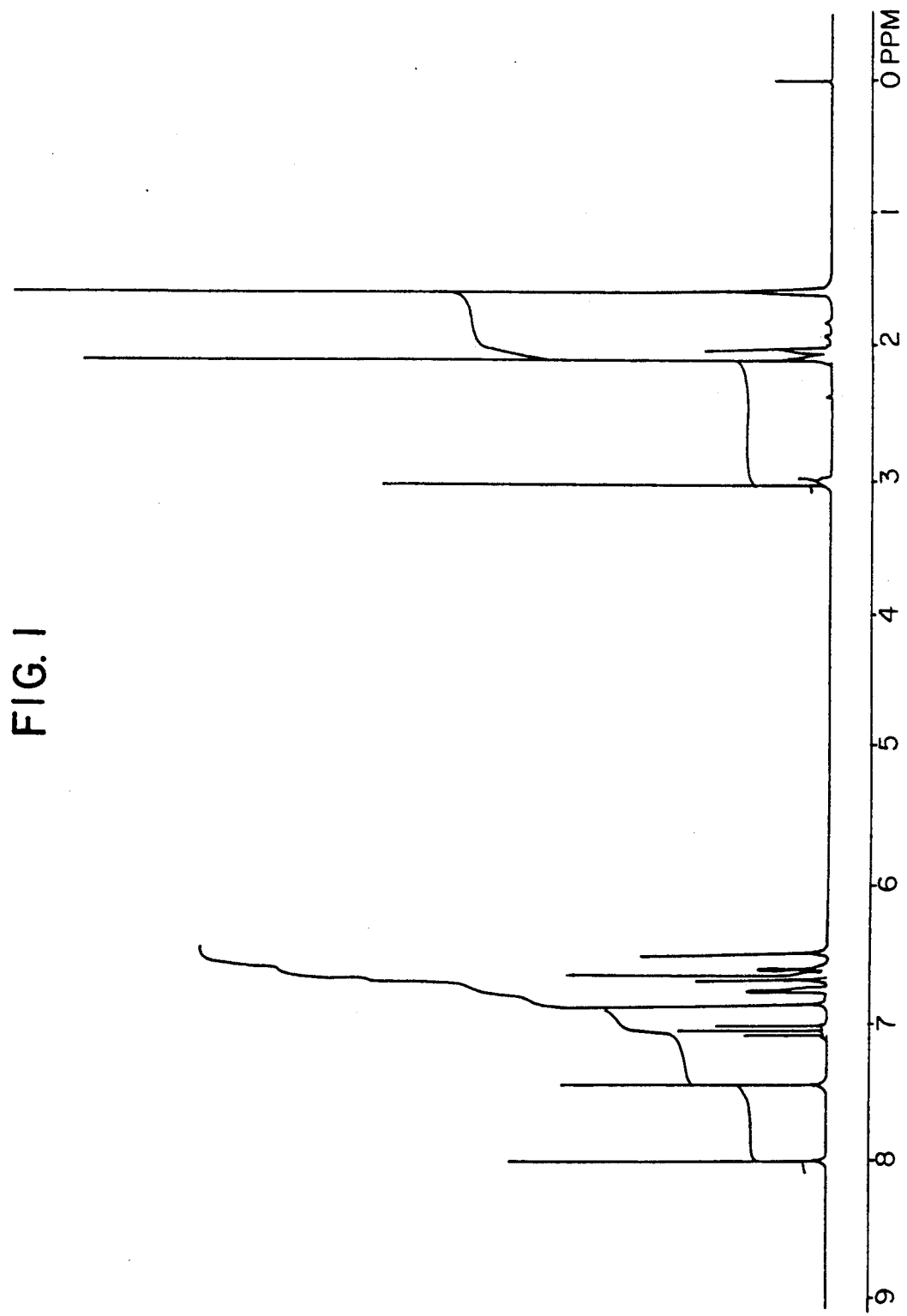
FIG. 1 is a $^1$H-NMR spectrum of 2-(3-hydroxyphenyl)-(2,5-dihydroxy-4-methylphenyl)propene obtained in Example 1.
Figure 2:
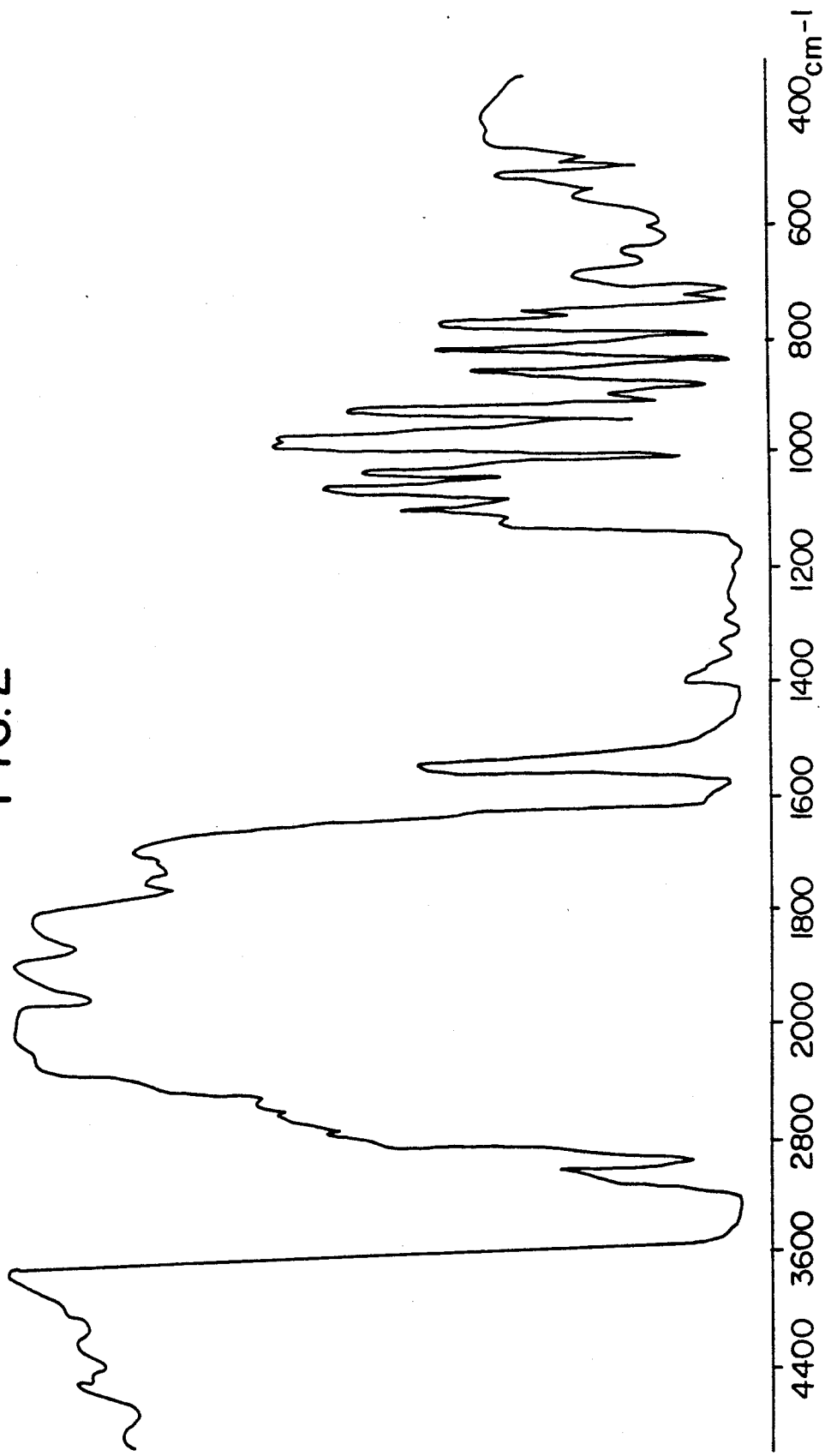
FIG. 2 is an infrared spectrum of 2-(3-hydroxyphenyl)-2-(2,5-dihydroxy-4-methylphenyl)propene obtained in Example 1.
Figure 3:
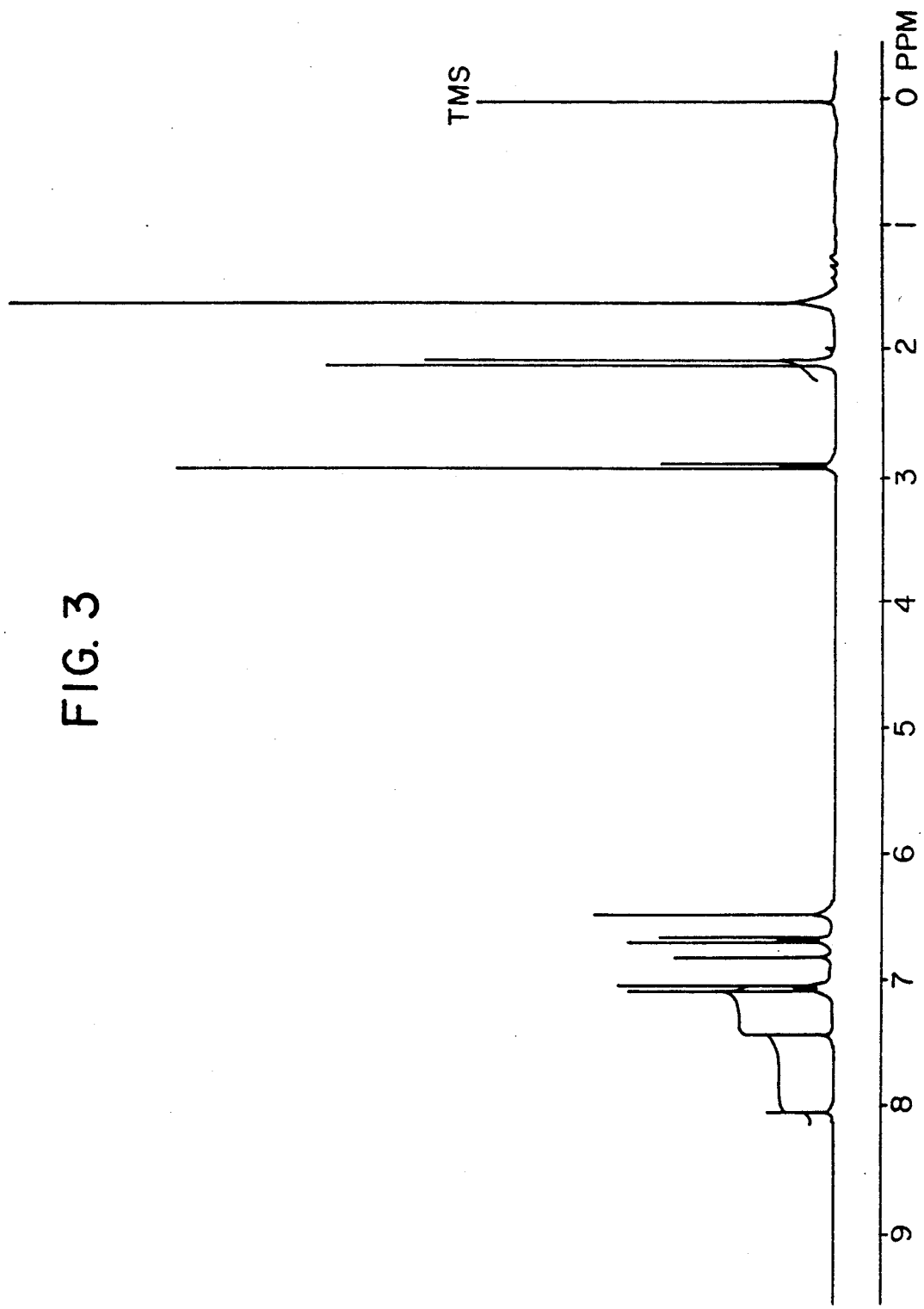
FIG. 3 is a $^1$H-NMR spectrum of 2-(4-hydroxyphenyl)-(2,5-dihydroxy-4-methylphenyl)propene obtained in Example 2.
Figure 4:
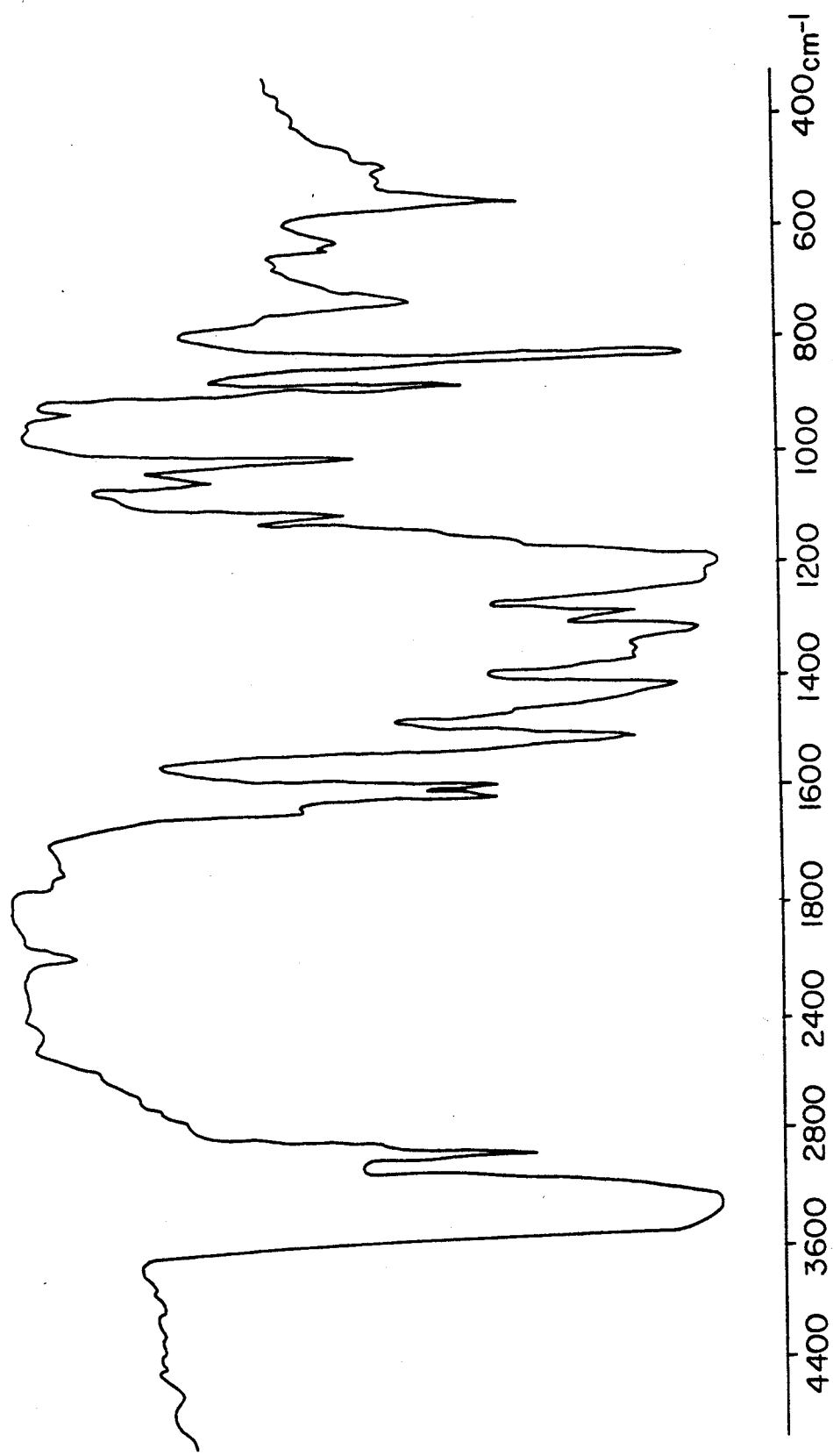
FIG. 4 is an infrared spectrum of 2-(4-hydroxyphenyl)-2-(2,5-dihydroxy-4-methylphenyl)propene obtained in Example 2.
Figure 5:
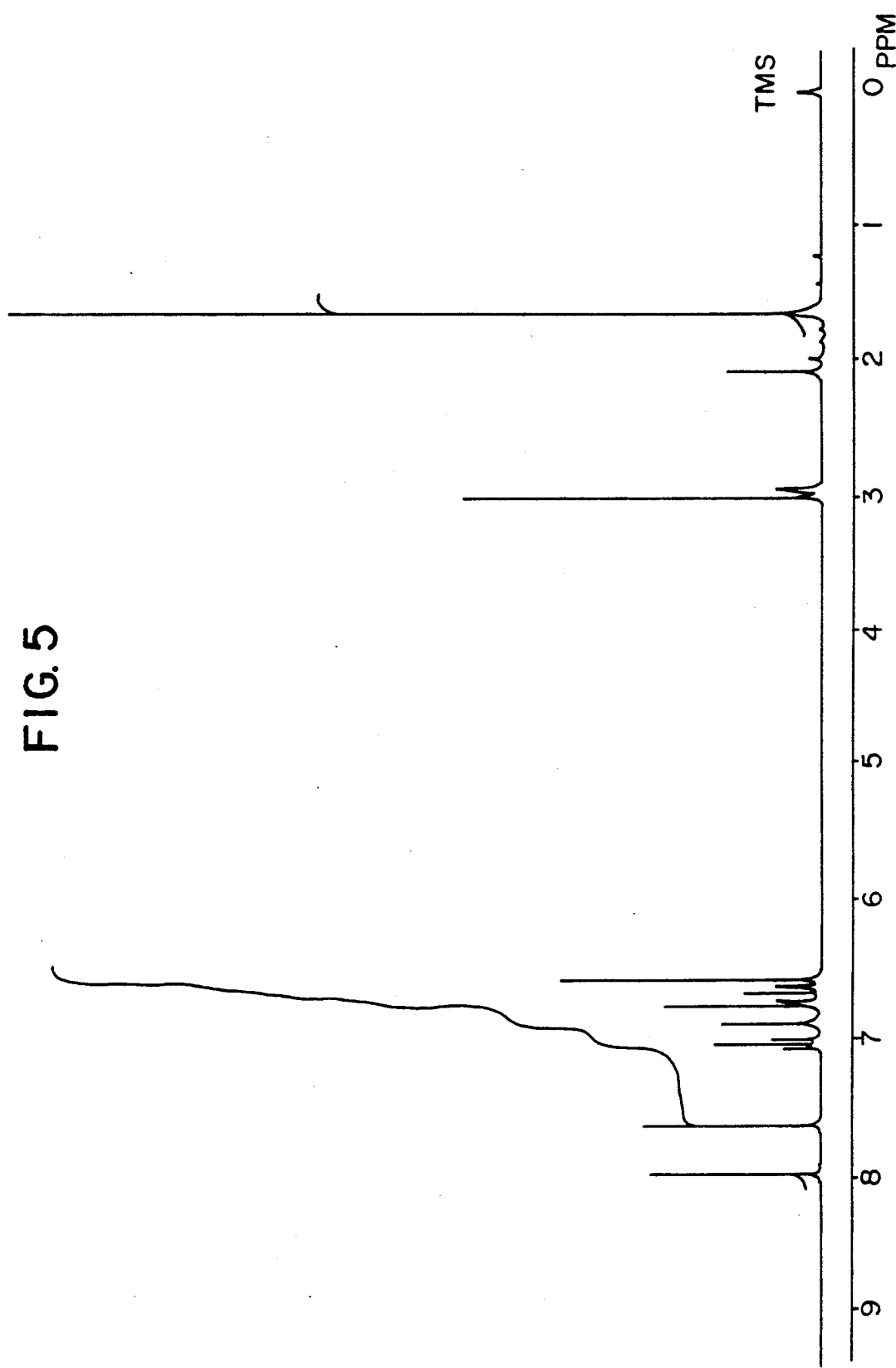
FIG. 5 is a 1H-NMR spectrum of 2-(3-hydroxyphenyl)-(2,5-dihydroxyphenyl)propene obtained in Example 3.
Figure 6:
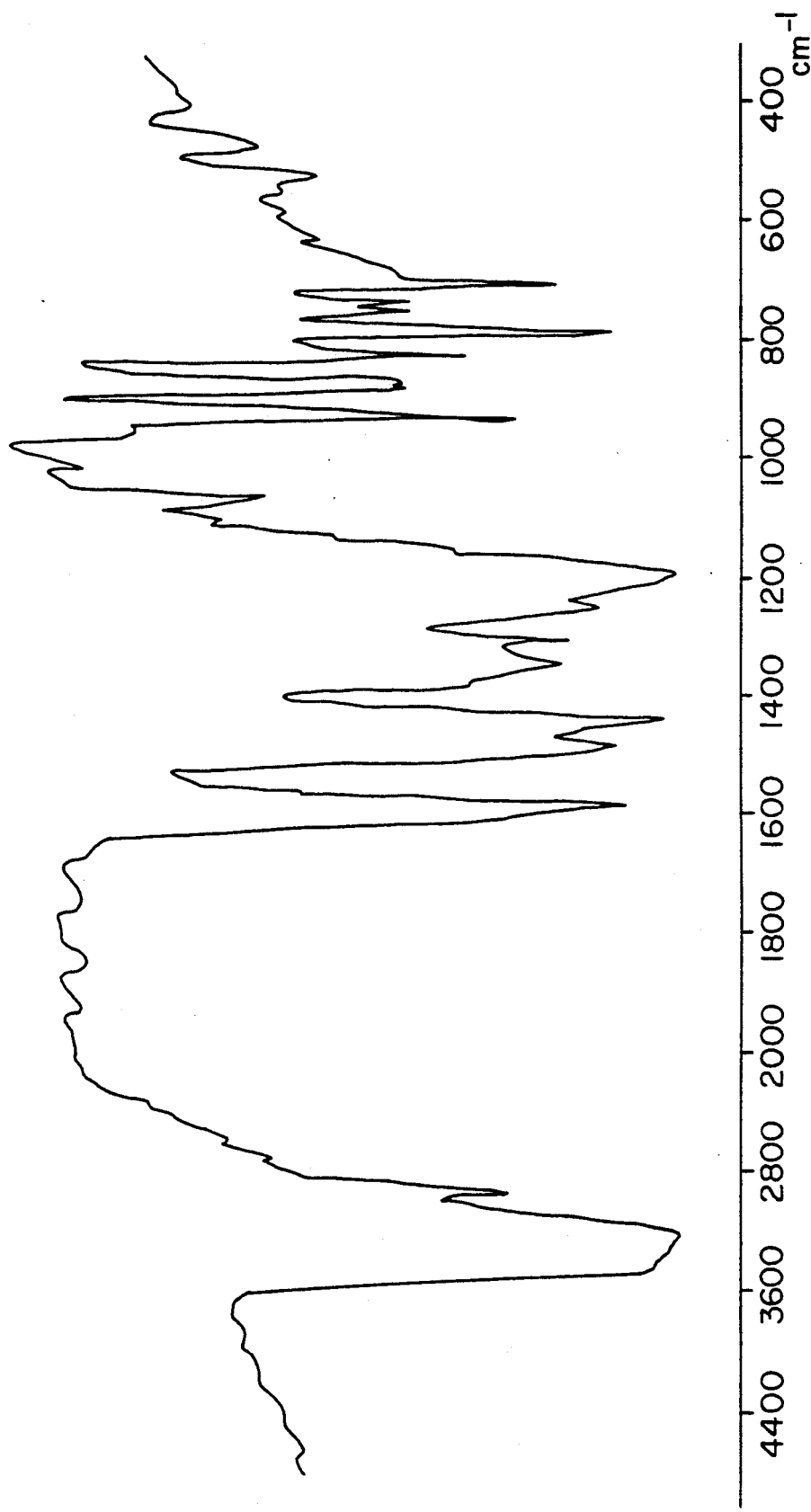
FIG. 6 is an infrared spectrum of 2-(3-hydroxyphenyl)-2-(2,5-dihydroxyphenyl)propene obtained in Example 3.
Figure 7:
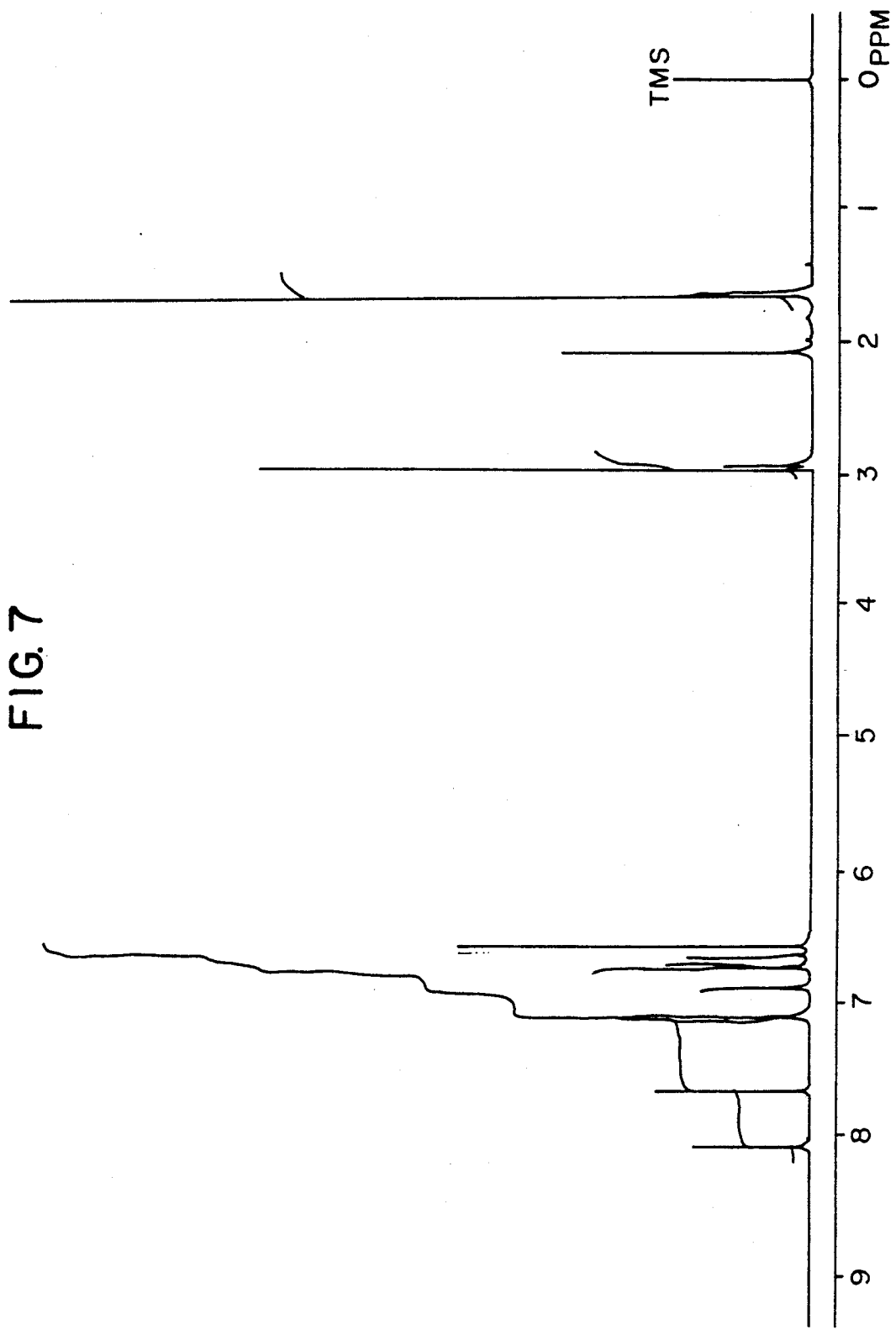
FIG. 7 is a $^1$H-NMR spectrum of 2-(4-hydroxyphenyl)-(2,5-dihydroxyphenyl)propene obtained in Example 4.
Figure 8:
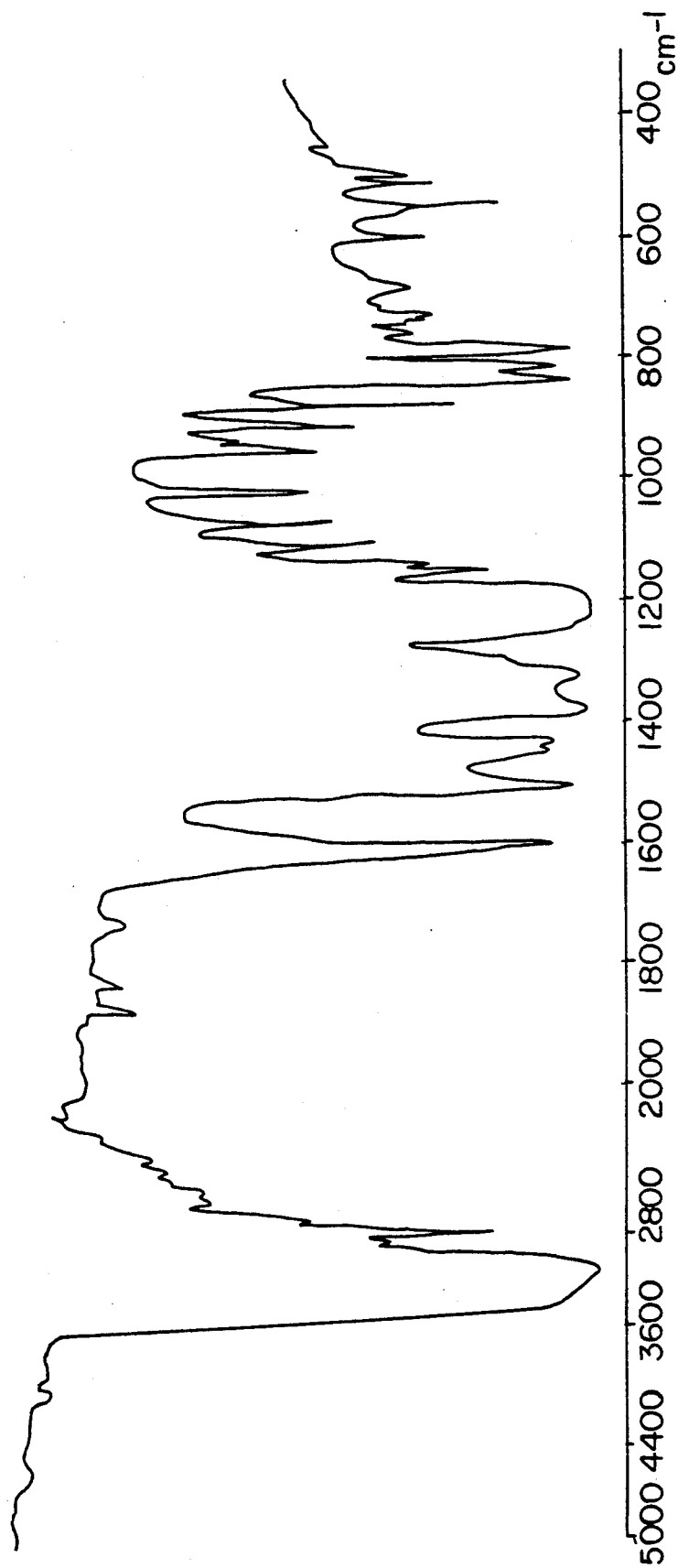
FIG. 8 is an infrared spectrum of 2-(4-hydroxyphenyl)-2-(2,5-dihydroxyphenyl)propene obtained in Example 4.
Figure 9:
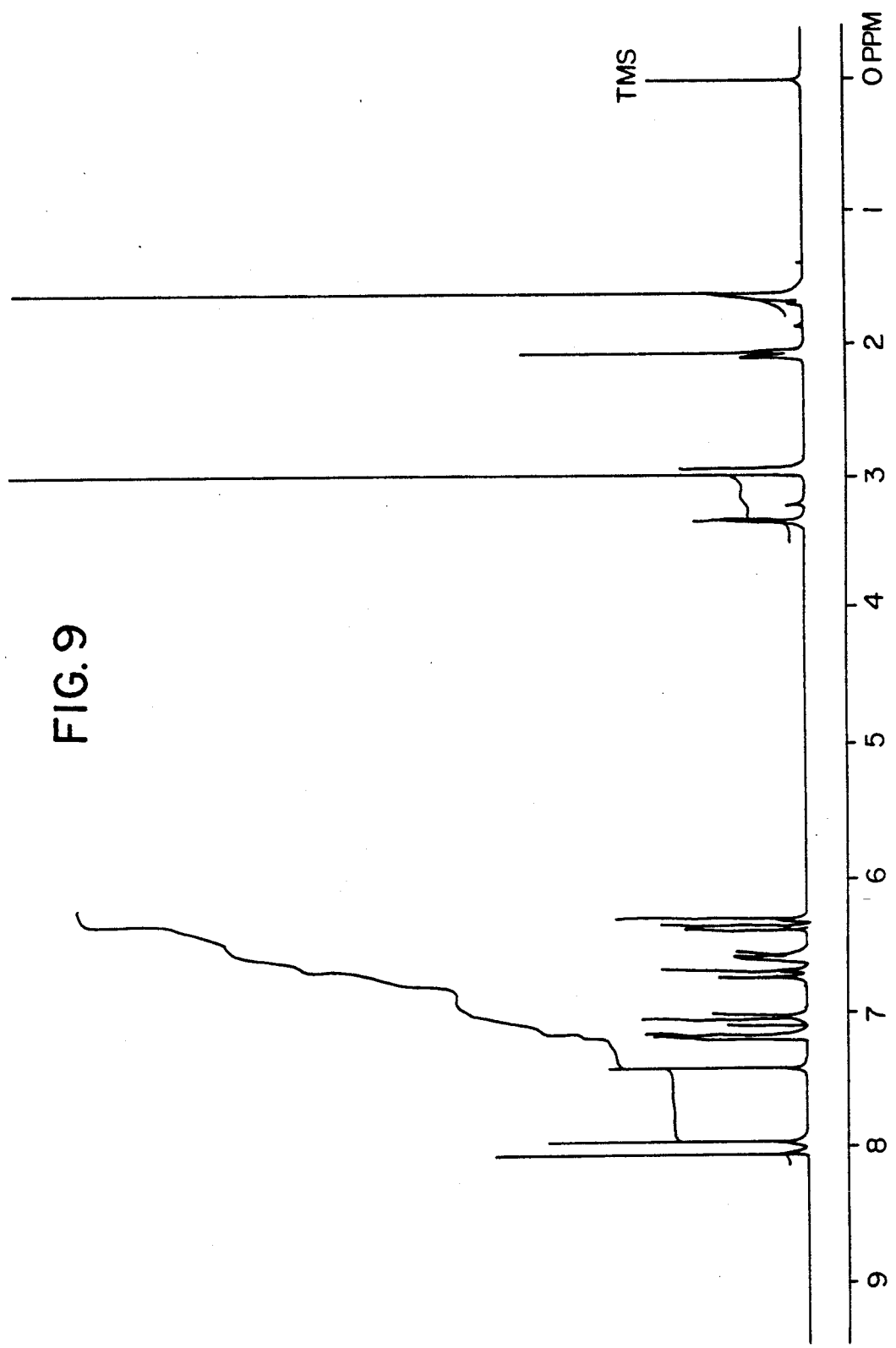
FIG. 9 is a $^1$H-NMR spectrum of 2-(3-hydroxyphenyl)-2-(2,4-dihydroxyphenyl)propene obtained in Example 5.
Figure 10:
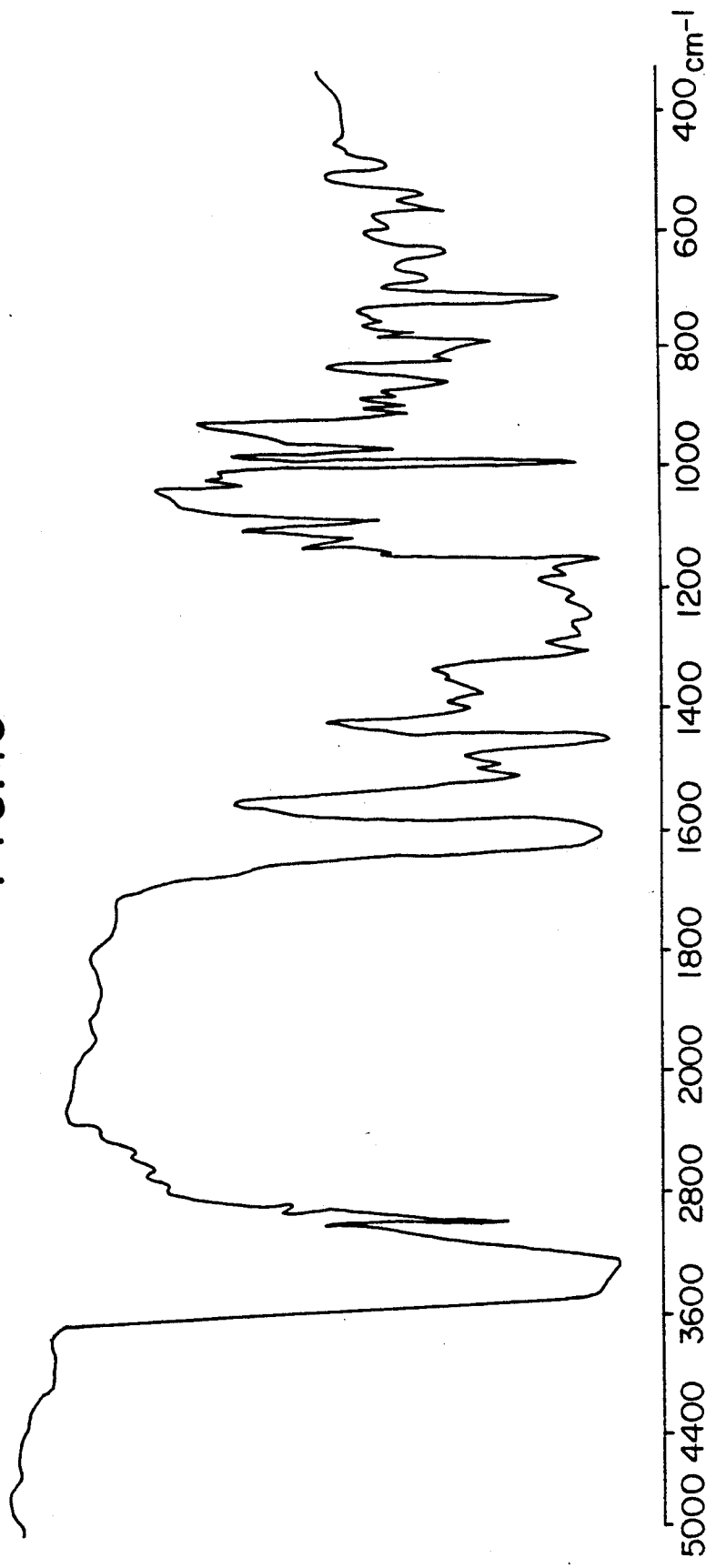
FIG. 10 is an infrared spectrum of 2-(3-hydroxyphenyl)-2-(2,4-dihydroxyphenyl)propene obtained in Example 5.
Figure 11:
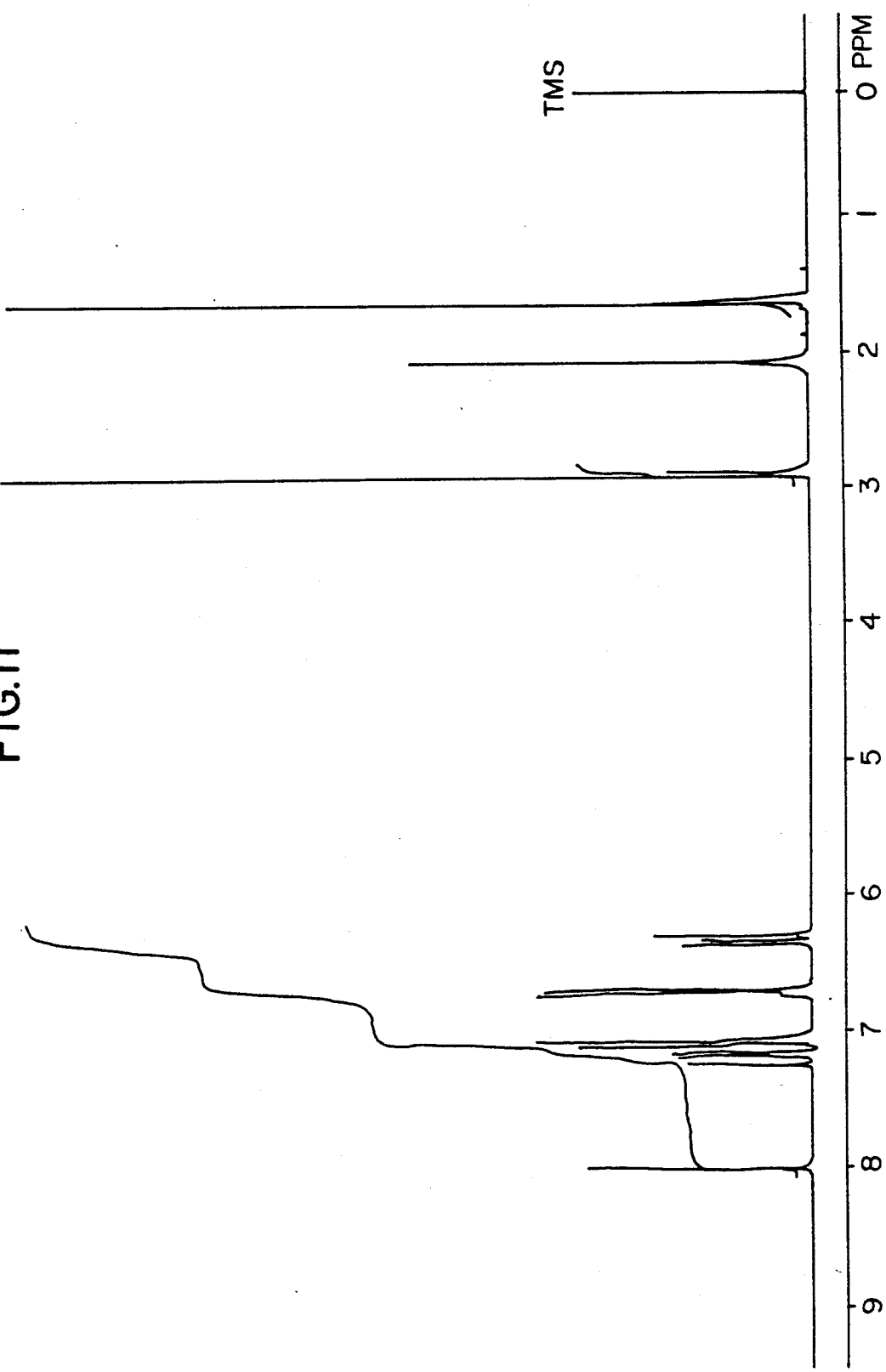
FIG. 11 is a $^1$H-NMR spectrum of 2-(4-hydroxyphenyl)-2-(2,4-dihydroxyphenyl)propene obtained in Example 6.
Figure 12:
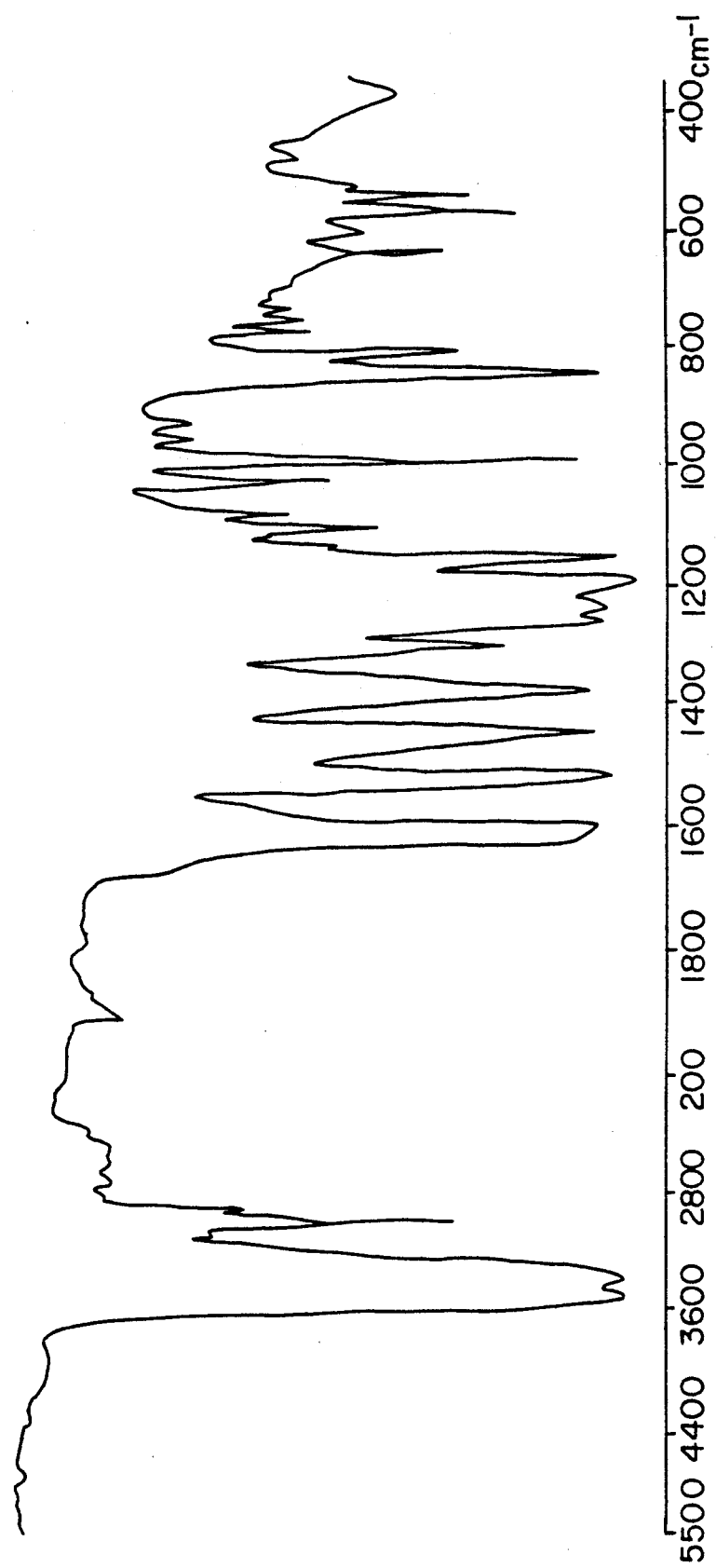
FIG. 12 is an infrared spectrum of 2-(4-hydroxyphenyl)-2-(2,4-dihydroxyphenyl)propene obtained in Example 6.

In the general formula (I), each of $R_1$ and $R_2$ is a hydrogen atom or an alkyl, alkenyl, cycloalkyl, alkoxy or aryl group. Preferably, both of $R_1$ and $R_2$ are a $C_1$-$C_4$ alkyl group, particularly methyl. If at least one of $R_1$ and $R_2$ is a hydrogen atom, an alkyl or aryl group is present at the ortho position to a hydroxyl group which is present at the ortho position to X. That is, for example, if $Y_2$ is a hydroxyl group, $Z_3$ should be an alkyl or aryl group; or if $Y_3$ is a hydroxyl group, $Z_4$ should be an alkyl or aryl group. A $C_1$-$C_4$ alkyl group is preferably present at the ortho position to a hydroxyl group which is present at the ortho position X. Each of $Z_1$, $Z_2$, $Z_3$, $Z_4$, $Z_5$ and $Z_6$ is a hydrogen atom, an alkyl, an aryl group, a halogen atom or a hydroxyl group, provided that at least one of $Z_1$, $Z_2$, $Z_3$, $Z_4$, $Z_5$ and $Z_6$ is a hydroxyl group. Preferably, an alkyl group has 1 to 4 carbon atoms.

Preferably, at least one of $Z_1$, $Z_2$, $Z_3$, $Z_4$, $Z_5$ and $Z_6$ is a hydroxyl group and the remainders are hydrogen atoms. Also preferably, two of $Z_1$, $Z_2$, $Z_3$, $Z_4$, $Z_5$ and $Z_6$ are hydroxyl groups.

When not less than two of $Z_1$, $Z_2$, $Z_3$, $Z_4$, $Z_5$ and $Z_6$ are hydroxyl groups, preferably, at least one of $Z_1$, $Z_2$ and $Z_3$ is a hydroxyl group and at least one of $Z_4$, $Z_5$ and $Z_6$ is a hydroxyl group.

Each of $Y_1$, $Y_2$, $Y_3$ and $Y_4$ is a hydrogen atom, an alkyl group, a halogen atom or a hydroxyl group, provided that at least one of them is a hydroxyl group. Preferably, one or two of them is or are a hydroxyl group.

Among the above cases, most preferably, one of $Z_1$, $Z_2$ and $Z_3$ is a hydroxyl group and the remainders are hydrogen atoms, one of $Z_4$, $Z_5$ and $Z_6$ is a hydroxyl group and the remainders are hydrogen atoms, one or two of $Y_1$, $Y_2$, $Y_3$ and $Y_4$ is or are a hydroxyl group, and both of $R_1$ and $R_2$ are methyl.

Examples of the phenol compound of the general formula (I) include, for example, a phenol compound of the formula (II):

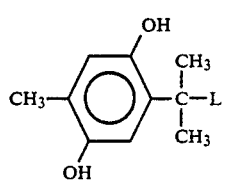

wherein L is

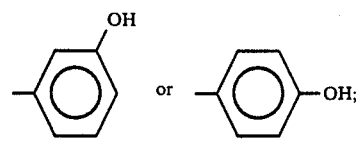

a phenol compound of the formula (III):

wherein M is

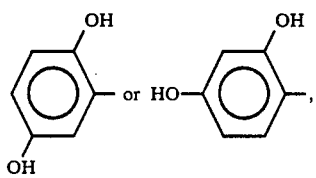

and E is

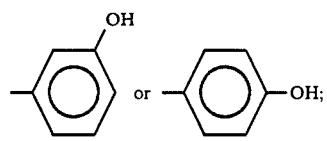

Specific examples include:

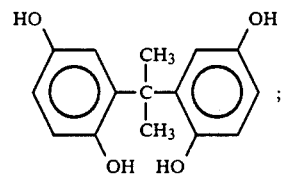

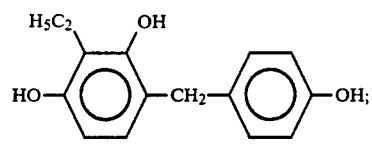

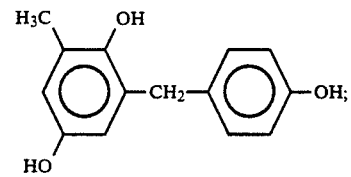

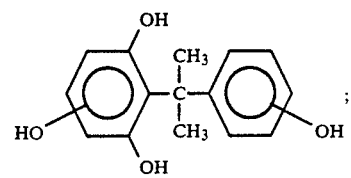

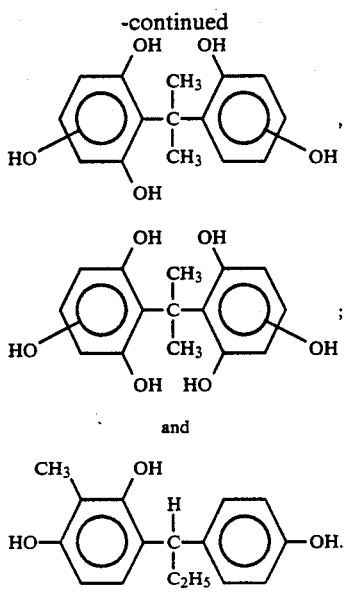

Among the phenol compounds (I), the phenol compound of the formula (II) and the phenol compound of the formula (III) are novel and preferable.

The phenol compound (II) can be synthesized by a reaction of methylhydroquinone with 2-(3-hydroxyphenyl)-propene or 2-(4-hydroxyphenyl)propene in the presence of an acid catalyst in a polar solvent.

The phenol compound (III) can be synthesized by a reaction of hydroquinone or resorcinol with 2-(3-hydroxy-phenyl)propene or 2-(4-hydroxyphenyl)propene.

Examples of the acid catalyst are aluminum chloride, complexes of boron trifluoride, tin (II) chloride, zinc chloride, sulfuric acid and so on.

Examples of the polar solvent are dioxane, nitro-benzene, monochlorobenzene, water, acetic acid and so on.

More specific reaction conditions for preparing the phenol compound (II) or (III) are as follows.

In the synthesis of the compound (II), preferably, dioxane as the solvent and aluminum chloride as the catalyst are used. Further, the reaction temperature can range between 20 ° C. and the boiling point of dioxane depending on the amount of the catalyst.

Preferably, in the synthesis with the use of 2-(3-hydroxyphenyl)propene, the temperature is from 50° to 100° C. In the synthesis with the use of 2-(4-hydroxyphenyl)propene, the temperature is from 50° to 80° C.

Methylhydroquinone is used in a molar ratio of not less than 1.2, preferably 2.5–4.0 to 2-(3-hydroxyphenyl)-propene or 2-(4-hydroxyphenyl)propene.

Aluminum chloride is used in a molar ratio of 0.05–2.0, preferably 0.2–0.5 to 2-(3-hydroxyphenyl)propene or 2-(4-hydroxyphenyl)propene.

In the synthesis of 2-(3-hydroxyphenyl)-2-(2,4-dihydrxyphenyl)propane of the compound (III), preferably, acetic acid as the solvent and sulfuric acid as the catalyst are used. The reaction temperature can range between 10 ° C. and the boiling point of acetic acid, preferably 15°–40 ° C. depending on the amount of the catalyst. Resorcinol is used in a molar ratio of not less than 1.2, preferably 2.5–4.0 to 2-(3-hydroxyphenyl)propene. Sulfuric acid is used in a molar reaction ratio of not less than 0.01, preferably 0.5–1.5 to 2-(3-hydroxyphenyl)propene.

In the synthesis of 2-(4-hydroxyphenyl)-2-(2,4-dihydroxyphenyl)propane of the compound (III), preferably, dioxane as the solvent and aluminum chloride as the catalyst are used. The reaction temperature can range between 10 ° C. and the boiling point of dioxane, preferably 15°–40 ° C. depending on the amount of the catalyst. Resorcinol is used in a molar ratio of not less than 1.2, preferably 2.5–4.0 to 2-(4-hydroxyphenyl)propene. Aluminum chloride is used in a molar ratio of 0.05–2.0, preferably 0.3–0.5 to 2-(4-hydroxy-phenyl)propene.

In the synthesis of 2-(3-hydroxyphenyl)-2-(2,4-dihydroxyphenyl)propane of the compound (III), preferably, dioxane as the solvent and aluminum chloride as the catalyst are used. The reaction temperature can range between 10 ° C. and the boiling point of dioxane, preferably 80°–100 ° C. depending on the amount of the catalyst. Hydroquinone is used in a molar ratio of not less than 1.2, preferably 2.5–4.0 to 2-(3-hydroxyphenyl)propene. Aluminum chloride is used in a molar ratio of 0.05–2.0, preferably 0.2–0.4 to 2-(3-hydroxyphenyl)propene.

In the synthesis of 2-(4-hydroxyphenyl)-2-(2,5-dihydroxyphenyl)propane of the compound (III). preferably, dioxane as the solvent and aluminum chloride as the catalyst are used. The reaction temperature can range between 10 ° C. and the boiling point of dioxane, preferably 60°–80° C. depending on the amount of the catalyst. Hydroquinone is used in a molar ratio of not less than 1.2, preferably 2.5–4.0 to 2-(4-hydroxyphenyl)propene. Aluminum chloride is used in a molar ratio of 0.05–2.0, preferably 0.3–0.5 to 2-(4-hydroxy-phenyl)-propene.

The quinone diazide sulfonic acid ester of the phenol compound (I) may be prepared by a per se conventional method. For example, the ester is prepared by a condensation reaction of the phenol compound with naphthoquinone diazide sulfonyl halogenide or benzoquinone diazide sulfonyl halogenide in the presence of a weak alkali such as sodium carbonate. It is preferable to carry out the reaction under such condition that an amount of a diester compound is not less than 50% by weight based on the total weight of the ester compounds.

Examples of the naphthoquinone diazide sulfonyl halogenide are naphthoquinone-(1,2)-diazide-(2)-5-sulfonyl chloride, naphthoquinone-(1,2)-diazide-(2)-4-sulfonyl chloride, benzoquinone-(1,2)-diazide-(2)-4-sulfonyl chloride and so on.

Among the esters, those with the phenol compound (II) or the phenol compound (III) are novel and in the scope of the present invention.

The quinone diazide sulfonic acid ester of the phenol compound (I) according to the present invention is particularly useful as a sensitizer to be used in a positive resist composition.

The positive resist composition of the present invention may contain two or more quinone diazide sulfonic acid esters of the phenol compound (I) in combination. The resist composition of the present invention may optionally include at least one ester of a phenol compound other than the phenol compound of the general formula (I).

Examples of the other phenol compound are hydroquinone, resorcinol, phloroglucin, 2,4-dihydroxybenzophenone, 2,3,4-trihydroxybenzophenone, tetrahydroxybenzo-phenones such as 2,3,3',4 -tetrahydroxybenzophenone, 2,3,4,4'-tetrahydroxybenzophenone and 2,2',4,4'-tetra-hydroxybenzophenone, pentahydroxybenzophenones such as 2,3,3',4,5'-pentahydroxybenzophenone, alkyl gallates, and the like.

A novolak resin is preferably used as the alkali-soluble resin. The novolak resin is prepared by an addition condensation reaction of a phenol with formaldehyde. Specific examples of the phenol used as one of the raw materials for the novolak resin include phenol, cresol, xylenol, ethylphenol, trimethylphenol, propylphenol, butylphenol, dihydroxybenzene, naphthols, etc. These phenols may be used alone or in combination.

The formaldehyde which undergoes he addition condensation reaction with the phenol can be used in the form of an aqueous solution of formaldehyde (formalin) or paraformaldehyde which is an oligomer of formaldehyde. Particularly, 37% formalin which is commercially mass produced is suitably used.

The addition condensation reaction of the phenol with formaldehyde can be carried out according to the usual method. This reaction is carried out at a temperature of from 60° to 120 ° C. for 2 to 30 hours. Organic acids, inorganic acids or divalent metal salts are used as catalysts. Specifically, exemplified are oxalic acid, hydrochloric acid, sulfuric acid, perchloric acid, p-toluenesulfonic acid, trichloroacetic acid, phosphoric acid, formic acid, zinc acetate, magnesium acetate, etc.

The reaction may be carried out in the presence or absence of a solvent.

The amount of the quinone diazide sulfonic acid ester to be added to the resist composition is from 15 to 50% by weight based on the total weight of the solid components in the resist composition.

The positive photoresist is prepared by mixing and dissolving the foregoing quinone diazide compound and the novolak resin in a solvent. Preferably, the used solvent evaporates at a suitable drying rate to give a uniform and smooth coating film. Such the solvent includes ethylcello-solve acetate, methylcellosolve acetate, ethylcellosolve, methylcellosolve, propylene glycol monomethyl ether acetate, butyl acetate, methyl isobutyl ketone, xylene, etc. To the positive photoresist composition obtained by the foregoing method, small amounts of resins, dyes, etc. may be added if desired.

With the resist composition of the present invention, the γ-value can be improved and the problems associated with increase of developing remains can be solved.

PREFERRED EMBODIMENTS OF THE INVENTION

The present invention will be illustrated more in detail with the following Examples, but it is not limited to these Examples. In Examples, "parts" are by weight.

EXAMPLE 1

To 54 g of dioxane, 1.9 g of aluminum chloride and 17.8 g of methylhydroquinone were added and stirred at 50°-55° C. to obtain a homogeneous solution. To the solution, 6.0 g of 2-(3-hydroxyphenyl)propene dissolved in 18 g of dioxane was dropwise added over 1 hour followed by stirring for further 1.5 hours. During the reaction, the temperature was kept at 50°-55° C. The resulting solution was extracted with 400 g of ethyl acetate and 800 g of water. Then, the ethyl acetate layer was washed three times with 800 g of water and concentrated to obtain an oily compound.

To 22.4 g of the oily compound, 5 g of ethyl acetate and 50 g of chloroform were added. Thereafter, the resulting solution was cooled with ice to obtain 9.5 g of a crystalline material. To the crystalline material, 1000 g of 9.5% hydrochloric acid was added, stirred for 1 hour at room temperature and filtered to obtain 5.9 g of a crystalline material. To this crystalline material, 9 g of ethyl acetate and 90 g of chloroform were added. The resulting solution was cooled with ice for recrystallization. Thereafter, the resulting mixture was filtered to obtain a crystalline compound. Then the crystalline compound was dried at 60° C. to obtain 2.9 g of the compound of the formula (1):

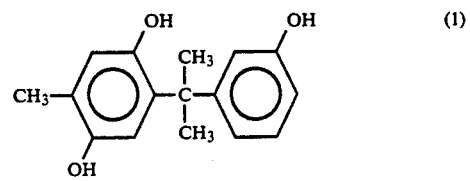

Melting point: 158°-159° C.

NMR in acetone d$_6$ (standard: TMS): δ(ppm) =1.60 (s, 6H), 2.11 (s, 3H), 6.47(s, 1H), 6.58 (m, 1H), 6.61 (s, 1H), 6.66 (t, 1H), 6.74 (m, 1H), 6.85 (s, 1H), 7.04 (t, 1H), 7.44 (s, 1H), 7.99 (s, 1H)

IR: $\nu$=3100-3600 (cm$^{-1}$) (OH)

MS m/e 258 (M+)

EXAMPLE 2

To 167.0 g of dioxane, 7.50 g of aluminum chloride was added and stirred at 50°-55° C. to obtain a homogeneous solution. After adding 55.5 g of methyl hydroquinone to the solution, the temperature was raised to 73° C. To the resulting mixture, 5.0 g of 2-(4-hydroxyphenyl)propene dissolved in 45.0 g of dioxane was dropwise added over 1.5 hours followed by stirring for further 1 hour. During the reaction, the temperature was kept at 73°±2° C.

The resulting solution was extracted with 400 g of ethyl acetate and 1000 g of water. Thereafter, the ethyl acetate layer was washed three times with 800 g of water and concentrated to obtain an oily compound. To 46.9 g of the oily compound, 95 g of 1,2-dichloroethane was added to obtain 7.2 g of a wet cake. The wet cake was dissolved in 10 g of ethyl acetate and 90 g of chloroform. Thereafter the resulting solution was cooled with ice for recrystallization. The resulting mixture was filtered to obtain a crystalline compound. Then the crystalline compound was dried at 60° C. to obtain 4.3 g of the compound of the formula (2):

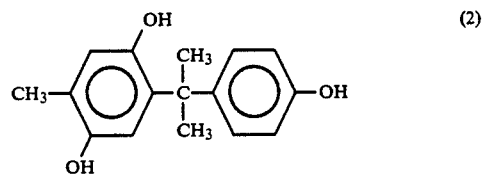

Melting point: 185°-186° C.

NMR in acetone d$_6$ (standard: TMS): δ (ppm) =8.04 (s, 1H), 7.42 (s, 1H), 7.06 (d, 2H), 6.80 (s, 1H), 6.69 (d, 2H), 6.47 (s, 1H), 2.10 (s, 3H), 1.61 (s, 6H)

IR: $\nu$=3000-3600 (cm$^{-1}$) (OH)

MS: m/e 258 (M+)

EXAMPLE 3

To 735 g of dioxane, 19.5 g of aluminum chloride was added and stirred at 50°-55° C. to obtain a homogeneous solution. After adding 245 g of hydroquinone to the solution, the temperature was raised to 97° C. To the resulting mixture, 102 g of 2-(3-hydroxyphenyl)propene in 300 g of dioxane was dropwise added over 2.5 hours followed by stirring for further 1.5 hours. During the reaction, the temperature was kept at 97°±2° C. After cooling down to the room temperature, to the resulting solution, 735 g of toluene was added and stirred for 0.5 hour. The resulting mixture was filtered and the filtrate was extracted with 3000 g of ethyl acetate and 1500 g of water. Thereafter, the ethyl acetate layer was washed five times with 1500 g of water and concentrated to obtain an oily compound. To 240 g of the oily compound, 100 g of ethyl acetate and 650 g of chloroform were added for recrystallization. Thereafter, by keeping the temperature below 5° C., the material was precipitated. The resulting mixture was filtered to obtain a crystalline compound. Then the crystalline compound was washed with 150 g of chloroform and dried at 40° C. to obtain 74.2 g of the compound of the formula (3):

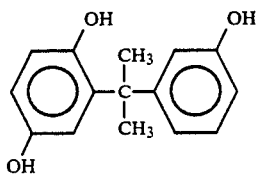
(3)

Melting point: 151° C.

NMR in acetone $d_6$ (standard: TMS): δ (ppm) =1.63 (s, 6H), 6.55 (d, 2H), 6.59 (m, 1H), 6.67 (t, 1H), 6.73 (m, 1H), 6.74 (s, 1H), 6.89 (t, 1H), 7.04 (t, 1H), 7.63 (s, 1H), 7.98 (s, 1H)

IR: $\nu$=3200-3500 (cm$^{-1}$) (OH)

MS: m/e 244 (M+)

EXAMPLE 4

To 158 g of dioxane, 8.0 g of aluminum chloride was added and stirred at 50°-55° C. to obtain a homogeneous solution. After adding 52.5 g of hydroquinone to the solution, the temperature was raised to 73° C. To the resulting mixture, 16 g of 2-(4-hydroxyphenyl)propene dissolved in 48 g of dioxane was dropwise added over 2.5 hours followed by stirring for further 1 hour. During the reaction, the temperature was kept at 73°±2° C. After cooling down to the room temperature, the mixture was kept standing for 11 hours and filtered. 227 Grams of the filtrate was concentrated to 123 g. The concentrate was extracted with 500 g of ethyl acetate and 100 g of water. The ethyl acetate layer was washed five times with 1000 g of water. The resulting solution was concentrated to obtain an oily compound. To 35 g of the oily compound, 50 g of 1,2-dichloroethane was added. Thereafter, the resulting solution was cooled with ice to obtain 11.2 g of a wet cake.

To the wet cake, 32 g of ethyl acetate and 190 g of chloroform were added and cooled with ice to obtain a crystalline compound. The crystalline compound was dried at 60° C. to obtain 3.8 g of the compound of the formula (4):

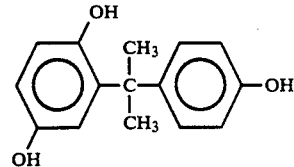
(4)

Melting point: 179°-180° C.

NMR in acetone $d_6$ (standard: TMS): δ (ppm)=1.63 (s, 6H), 6.54 (d, 2H), 6.61 (s, 1H), 6.70 (d, 2H), 6.85 (t, 1H), 7.06 (d, 2H), 7.63 (s, 1H), 8.04 (s, 1H)

IR: $\nu$=3100-3600 (cm$^{-1}$) (OH)

MS: m/e 244 (M+)

EXAMPLE 5

At 19°-20° C., to 132 g of acetic acid, 6.0 g of sulfuric acid and 33.0 g of resocinol were added and stirred to obtain a homogeneous solution. To the solution, 8.1 g of 2-(3-hydroxyphenyl)propene dissolved in 20 g of dioxane was dropwise added over 1 hour followed by stirring for further hour. During the reaction, the temperature was kept at 20°-23° C. The resulting solution was extracted with 200 g of isoamyl acetate and 500 g of water. Thereafter, the isoamyl acetate layer was washed ten times with 500 g of water, and concentrated to obtain an oily compound. To 13.6 g of the oily compound, 42 g of chloroform was added and cooled with ice to obtain a crystalline compound. The crystalline compound was dried to obtain 8.3 g of the compound of the formula (5):

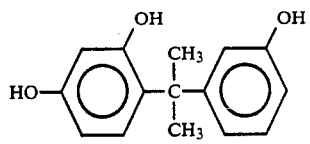
(5)

Melting point: 121°-122° C.

NMR in acetone $d_6$ (standard: TMS): δ (ppm) =1.61 (s, 6H), 6.28 (d, 1H), 6.34 (dd, 1H), 6.57 (m, 1H), 6.66 (t, 1H), 6.72 (m, 1H), 7.02 (t, 1H), 7.15 (d, 1H), 7.42 (s, 1H), 7.98 (s, 1H), 8.04 (s, 1H)

IR: $\nu$=3200-3600 (cm$^{-1}$) (OH)

MS: m/e 244 (M+)

EXAMPLE 6

At 19°-20° C., to 120 g of dioxane, 6.0 g of aluminum chloride and 39.4 of resorcinol were added and stirred to obtain a homogeneous solution. To the resulting solution 12.0 g of 2-(4-hydroxyphenyl)propene dissolved in 36 g of dioxane was dropwise added over 2 hours followed by stirring for further 1 hour. During the reaction, the temperature was kept at 20°-23° C. 265 Grams of the resulting solution was concentrated to 98 g. The concentrate was extracted with 350 g of isoamyl acetate and 1000 g of water. Thereafter the isoamyl acetate layer was washed five times with 1000 g of water and concentrated to obtain an oily compound. To 57 g of the oily compound, 320 g of carbon tetrachloride was added and cooled with ice to obtain 35.4 g of a wet cake. The wet cake was dissolved in 40 g of ethyl acetate. To the mixture, 200 g of carbon tetrachloride was added and cooled with ice to obtain a crystalline compound. The crystalline compound was dried at 60° C. to obtain 10.9 g of the compound of the formula (6):

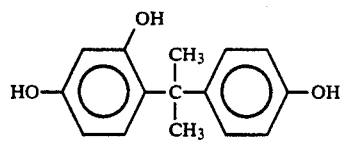
(6)

Melting point: 188°-189° C.

NMR in acetone d₆ (standard: TMS): δ (ppm) = 1.62 (s, 6H), 6.27 (d, 1H), 6.32 (dd, 1H), 6.68 (d, 2H), 7.05 (d, 2H), 7.13 (d, 1H), 7.22 (s, 1H), 7.98 (s, 1H), 7.99 (s, 1H)

IR: $\nu = 3200-3600$ (cm$^{-1}$) (OH)

MS m/e 244 (M+)

EXAMPLE 7

Synthesis of the sensitizer

In a 300 ml three-necked flask, 7.43 g of the compound (1) obtained in Example 1, 15.25 g of naphthoquinone-(1,2)-diazide-(2)-5-sulfonyl chloride (in the molar ratio of 1:2) and 227 g of dioxane were charged and stirred to achieve complete dissolution. 6.32 Grams of triethylamine was dropwise added over 30 minutes while stirring on a water bath to keep the reaction temperature at 20°-25° C. Reaction was carried out with stirring for further 4 hours at 20°-25° C. The reaction solution was then charged into ion-exchanged water, filtered and dried to obtain a sensitizer, which is referred to as sensitizer A.

EXAMPLE 8

Synthesis of the sensitizer

The same procedures as in Example 7 were repeated, except that the compound (2) obtained in Example 2 was used instead of the compound (1), to obtain a sensitizer, which is referred to as sensitizer B.

EXAMPLE 9

Synthesis of the sensitizer C

The same procedures as in Example 7 were repeated, except that 2,3,4-trihydroxybenzophenone was used instead of the compound (1), to obtain a sensitizer, which is referred to as sensitizer C.

EXAMPLE 10

Synthesis of the sensitizer D)

The same procedures as in Example 7 were repeated, except that 2,3,4,4'-tetrahydroxybenzophenone (in the molar ratio to naphthoquinone-(1,2)-diazide-(2)-5-sulfonyl chloride of 1:3) instead of the compound (1), to obtain a sensitizer, which is referred to as sensitizer D.

EXAMPLE 11

Synthesis of the sensitizer E

In a 300 ml three-necked flask, 7.43 g of the compound (3) obtained in Example 3, 16.12 g of naphthoquinone-(1,2)-diazide-(2)-5-sulfonyl chloride (in the molar ratio of 1:2) and 236 g of dioxane were charged and stirred to achieve complete dissolution. 6.68 Grams of triethylamine was dropwise added for 30 minutes while stirring on a water bath to keep the reaction temperature at 20°-25° C. Reaction was carried out with stirring for further 4 hours at 20°-25° C. The reaction solution was then charged into ion-exchanged water, filtered and dried to obtain a sensitizer, which is referred to as sensitizer E.

EXAMPLE 12

Synthesis of the sensitizer F

The same procedures as in Example 11 were repeated, except that the compound (4) obtained in Example 4 was used instead of the compound (3), to obtain a sensitizer, which is referred to as sensitizer F.

EXAMPLE 13

Synthesis of the sensitizer G

The same procedures as in Example 11 were repeated, except that the compound (5) obtained in Example 5 was used instead of the compound (3), to obtain a sensitizer, which is referred to as sensitizer G.

EXAMPLE 14

Synthesis of the sensitizer H

The same procedures as in Example 11 were repeated, except that the compound (6) obtained in Example 6 was used instead of the compound (3), to obtain a sensitizer, which is referred to as sensitizer H.

EXAMPLE 15

Synthesis of the sensitizer I

The same procedures as in Example 11 were repeated, except that 2,3,4-trihydroxybenzophenone was used instead of the compound (3), to obtain a sensitizer, which is referred to as sensitizer I.

EXAMPLE 16

Synthesis of the sensitizer J

The same procedures as in Example 11 were repeated, except that 2,3,4,4'-tetrahydroxybenzophenone (in the molar ratio to naphthoquinone-(1,2)-diazide-(2)-5-sulfonyl chloride of 1:3) instead of the compound (3), to obtain a sensitizer, which is referred to as sensitizer J.

EXAMPLE 17

Synthesis of the sensitizer K

In a 300 ml three-necked flask, 7.57 g of a compound of the below formula (7), 15.65 g of naphthoquinone-(1,2)-diazide-(2)-5-sulfonyl chloride (in the molar ratio of 1:2) and 232 g of dioxane were charged and stirred to achieve complete dissolution. 6.48 Grams of triethylamine was dropwise added for 30 minutes while stirring on a water bath to keep the reaction temperature at 20°-25° C. Reaction was carried out with stirring for further 4 hours at 20°-25° C. The reaction solution was then charged into ion-exchanged water, filtered and dried to obtain a sensitizer, which is referred to as sensitizer K.

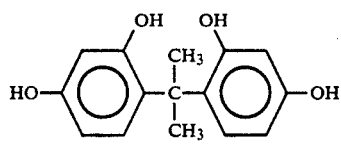
(7)

EXAMPLE 18

Synthesis of the sensitizer L

The same procedures as in Example 17 were repeated, except that 2,3,4-trihydroxybenzophenone was used instead of the compound (7), to obtain a sensitizer, which is referred to as sensitizer L.

EXAMPLE 19

Synthesis of the sensitizer M

The same procedures as in Example 17 were repeated, except that 2,3,4,4'-tetrahydroxybenzophenone (in the molar ratio to naphthoquinone-(1,2)-diazide-(2)-5-sulfonyl chloride of 1:3) was used instead of the compound (7), to ob a sensitizer, which is referred to as sensitizer M.

EXAMPLE 20

Synthesis of the sensitizer N

In a 300 ml three-necked flask, 4.60 g of a compound of the below formula (8), 10.75 g of naphthoquinone-(1,2)-diazide-(2)-5-sulfonyl chloride (in the molar ratio of 1:2) and 168 g of dioxane were charged and stirred to achieve homogeneous dissolution. 4.45 Grams of triethyl-amine was dropwise added over 30 minutes while stirring on a water bath to keep the reaction temperature at 20°-25° C. Reaction was carried out with stirring for further 4 hours at 20°-25° C. The reaction solution was then charged into ion-exchanged water, filtered and dried to obtain a sensitizer, which is referred to as sensitizer N.

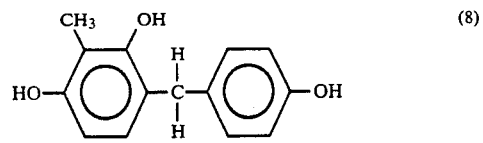

(8)

EXAMPLES 21-25

Synthesis of the sensitizers O to S

The same procedures as in Example 20 were repeated, except that a compound of the formula (9) or (10), 2,4,4'-trihydroxybenzophenone, 2,2',4,4'-tetrahydroxybenzophenone or 2,3,4-trihydroxybenzophenone was used instead of the compound (8), to obtain a sensitizer. Each of the sensitizer is referred to as sensitizer O, P, Q, R or S.

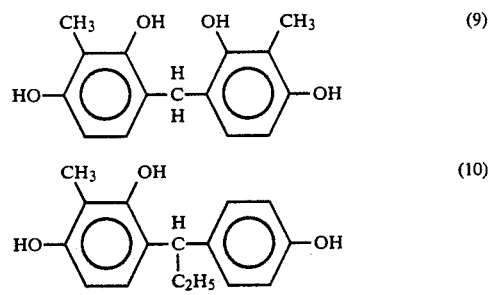

EXAMPLES 26-27 AND COMPARATIVE EXAMPLE 1-2

The sensitizer A, B, C, or D obtained in Examples 7-10 and a novolak resin in amounts shown in Table 1 were dissolved in 48 parts of ethyl cellosolve acetate to prepare a resist solution, which was filtered through a Teflon (trade mark) filter of 0.2 μm in pore size. The resist solution was coated on a silicon wafer, which had been rinsed in a usual manner, by means of a spinner so as to form a resist film of 1.3 μm in thickness. Subsequently, the silicon wafer was baked for 60 seconds on a hot plate kept at 100° C, and exposed to light while varying the exposure value stepwise by means of a reduction projection exposing apparatus (DSW 4800 with NA =0.42 manufactured by GCA) in having a wavelength of 436 nm. Thereafter, the silicon wafer was developed for 1 minute in a developing solution (SOPD manufactured by Sumitomo Chemical Company, Limited) to obtain a positive pattern. The γ-value is expressed in terms of tan θ the angle θ of which is obtained by plotting the rate of the standardized film thickness (=the retained film thickness/the original film thickness) against the exposure value and calculating the inclination of the plotted line. The γ-value and the resolution which was obtained at the same time are shown in Table 1.

TABLE 1

| | Resist Components | | | |
|---|---|---|---|---|
| | Novolak Resin*[1] (parts) | Sensitizer (parts) | γ-Value | NA = 0.42 Resolution (μm) |
| Example 26 | 17 | A, 5 | 4.0 | 0.5 |
| Example 27 | 17 | B, 5 | 4.0 | 0.5 |
| Comp. Example 1 | 17 | C, 5 | 2.1 | 0.6 |
| Comp. Example 2 | 17 | D, 5 | 2.3 | 0.6 |

Note:
*[1])Novolak Resin
A cresol mixture (the molar ratio of m-isomer to p-isomer: 7/3) was reacted with formalin (the molar ratio of formalin to cresol, 1/0.8) using oxalic acid as a catalyst under reflux to obtain a novolak resin of 9800 in weight average molecular weight calculated as polystyrene.

EXAMPLES 28-31 AND COMPARATIVE EXAMPLES 3-4

The same procedures as in Example 26 were repeated, except that the sensitizer E, F, G, H, I or J obtained in Examples 11-16 and the novolak resin in amounts shown in Table 2 were dissolved in 48 parts of ethyl cellosolve acetate, to prepare a resist solution and then to obtain a positive pattern. The γ-value and the resolution which was obtained at the same time are shown in Table 2.

EXAMPLE 32 AND COMPARATIVE EXAMPLES 5-6

The same procedures as in Example 26 were repeated, except that the sensitizer K, L, or M obtained in Examples 17-19 and the novolak resin were dissolved in 48 parts of ethyl cellosolve acetate in a composition shown in Table 3 to prepare a resist solution, and that a reduction projection exposing apparatus (DSW 4800 with NA =0.28 manufactured by GCA) was used to obtain a positive pattern. The γ-value and the resolution which was obtained at the same time are shown in Table 3.

EXAMPLES 33-35 AND COMPARATIVE EXAMPLES 7-9

The same procedures as in Example 32 were repeated, except that the sensitizer N, O, P, Q, R or S obtained in Examples 20-25 and the novolak resin in amounts shown in Table 4were dissolved in 48 parts of ethyl cellosolve acetate to prepare a resist solution and then to obtain a positive pattern. The γ-value and the resolution which was obtained at the same time are shown in Table 4.

TABLE 2

| | Resist Components | | | |
|---|---|---|---|---|
| | Novolak Resin*[1] (parts) | Sensitizer (parts) | γ-Value | NA = 0.42 Resolution (μm) |
| Example 28 | 17 | E, 5 | 4.0 | 0.5 |
| Example 29 | 17 | F, 5 | 4.0 | 0.5 |
| Example 30 | 17 | G, 5 | 4.0 | 0.55 |
| Example 31 | 17 | H, 5 | 4.0 | 0.55 |
| Comp. Example 3 | 17 | I, 5 | 2.1 | 0.6 |
| Comp. Example 4 | 17 | J, 5 | 2.0 | 0.6 |

Note:
*[1] See Note*[1] of Table 1.

TABLE 3

| | Resist Components | | |
|---|---|---|---|
| | Novolak Resin*[1] (parts) | Sensitizer (parts) | γ-Value |
| Example 32 | 17 | K, 5 | 3.6 |
| Comp. Example 5 | 17 | L, 5 | 2.1 |
| Comp. Example 6 | 17 | M, 5 | 2.0 |

Note:
*[1] See Note*[1] of Table 1.

TABLE 4

| | Resist Components | | |
|---|---|---|---|
| | Novolak Resin*[1] (parts) | Sensitizer (parts) | γ-Value |
| Example 33 | 17 | N, 5 | 3.7 |
| Example 34 | 17 | O, 5 | 3.5 |
| Example 35 | 17 | P, 5 | 3.5 |
| Comp. Example 7 | 17 | Q, 5 | 2.5 |
| Comp. Example 8 | 17 | R, 5 | 1.6 |
| Comp. Example 9 | 17 | S, 5 | 2.3 |

Note:
*[1] See Note*[1] of Table 1.

What is claimed is:

1. A positive resist composition which comprises an alkali-soluble resin and a quinonediazide sulfonic acid ester of a phenol compound of the general formula (I):

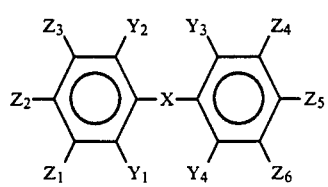

where $Y_1$, $Y_2$, $Y_3$ and $Y_4$ are the same or different and each a hydrogen atom, a $C_1$-$C_4$ alkyl group or a hydroxyl group, provided that one or two of $Y_1$, $Y_2$, $Y_3$ and $Y_4$ is or are a hydroxyl group; $Z_1$, $Z_2$, $Z_3$, $Z_4$, $Z_5$ and $Z_6$ are the same or different and each a hydrogen atom, a $C_1$-$C_4$ alkyl or a hydroxyl group, provided that at least one of $Z_1$, $Z_2$, and $Z_3$, and at least one of $Z_4$, $Z_5$ and $Z_6$ is a hydroxyl group; X is

in which $R_1$ is a hydrogen atom, a $C_1$-$C_4$ alkyl group or a $C_1$-$C_4$ alkoxy group, provided that a $C_1$-$C_4$ alkly group is present at the ortho position to a hydroxyl group which is present at the ortho position to X.

2. The positive resist composition according to claim 1, wherein $R_1$ is a $C_1$-$C_4$ alkyl group; and at least one of $Y_2$ and $Y_3$, is a hydroxyl group, provided that at least one of $Z_3$ and $Z_4$ which are at the ortho positions to the hydroxyl group is a $C_1$-$C_4$ alkyl group.

3. The positive resist composition according to claim 1, wherein $Z_1$, $Z_2$, $Z_3$, $Z_4$, $Z_5$ and $Z_6$ are the same or different and a hydrogen atom or a hydroxyl group, provided that at least one of $Z_1$, $Z_2$, $Z_3$, $Z_4$, $Z_5$ and $Z_6$ is a hydroxyl group.

4. The positive resist composition according to claim 1, wherein two of $Z_1$, $Z_2$, $Z_3$, $Z_4$, $Z_5$ and $Z_6$ are hydroxyl groups.

5. Sensitizer consisting of a quinone diazide sulfonic acid ester of a phenol compound of the general formula (I):

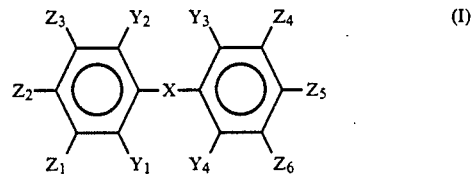

wherein $Y_1$, $Y_2$, $Y_3$ and $Y_4$ are the same or different and each a hydrogen atom, a $C_1$-$C_4$ alkyl group or a hydroxyl group, provided that one or two of $Y_1$, $Y_2$, $Y_3$ and $Y_4$ is or are a hydroxyl group; $Z_1$, $Z_2$, $Z_3$, $Z_4$, $Z_5$ and $Z_6$ are the same or different and each a hydrogen atom, a $C_1$-$C_4$ alkyl or a hydroxyl group, provided that at least one of $Z_1$, $Z_2$, and $Z_3$, and at least one of $Z_4$, $Z_5$ and $Z_6$ is a hydroxyl group; X is

in which $R_1$ is a hydrogen atom, a $C_1$-$C_4$ alkyl group or a $C_1$-$C_4$ alkoxy group, provided that a $C_1$-$C_4$ alkyl group is present at the ortho position to a hydroxyl group which is present at the ortho position to X.

6. A quinone diazide sulfonic acid ester of a phenol compound of the formula (II):

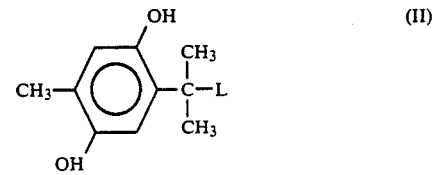

wherein L is

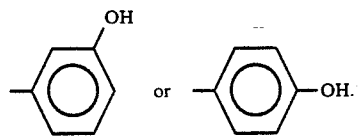

7. A quinone diazide sulfonic acid ester of a phenol compound of the formula (III):

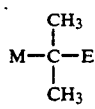     (III)

wherein M is

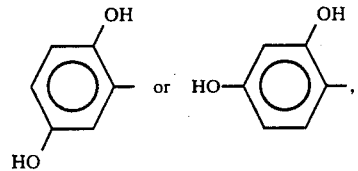

and E is

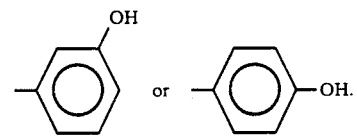

8. A positive resist composition which comprises an alkali-soluble resin and a quinone diazide sulfonic acid ester of a phenol compound of the formula (II):

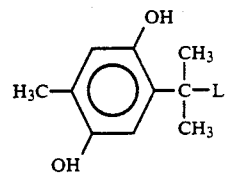   (II)

wherein L is

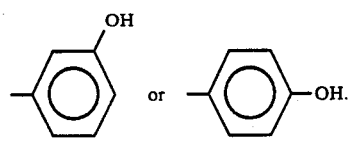

9. A positive resist composition which comprises an alkali-soluble resin and a quinone diazide sulfonic acid ester of a phenol compound of the formula (III):

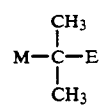     (III)

wherein M is

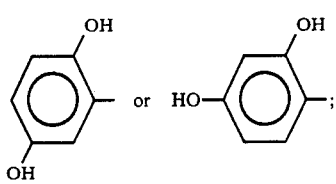

and E is

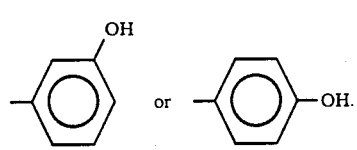

10. The positive resist composition according to claim 1, wherein one of $Z_1$, $Z_2$ and $Z_3$ is a hydroxyl group, one of $Z_4$, $Z_5$ and $Z_6$ is a hydroxyl group, and $R_1$ is a methyl group.

* * * * *